United States Patent
Albin et al.

(10) Patent No.: US 9,324,898 B2
(45) Date of Patent: Apr. 26, 2016

(54) VARYING CADMIUM TELLURIDE GROWTH TEMPERATURE DURING DEPOSITION TO INCREASE SOLAR CELL RELIABILITY

(71) Applicants: Alliance for Sustainable Energy, LLC, Golden, CO (US); First Solar, Inc., Toledo, OH (US)

(72) Inventors: David S. Albin, Denver, CO (US); James Neil Johnson, Scotia, NY (US); Yu Zhao, Niskayuna, NY (US); Bastiaan Arie Korevaar, Schenectady, NY (US)

(73) Assignee: Alliance For Sustainable Energy, LLC, Golden, CO (US)

( * ) Notice: Subject to any disclaimer, the term of this patent is extended or adjusted under 35 U.S.C. 154(b) by 291 days.

(21) Appl. No.: 14/036,229

(22) Filed: Sep. 25, 2013

(65) Prior Publication Data

US 2014/0083505 A1     Mar. 27, 2014

Related U.S. Application Data

(60) Provisional application No. 61/705,546, filed on Sep. 25, 2012.

(51) Int. Cl.
*H01L 21/00* (2006.01)
*H01L 31/073* (2012.01)
(Continued)

(52) U.S. Cl.
CPC ........ *H01L 31/073* (2013.01); *H01L 21/02422* (2013.01); *H01L 21/02474* (2013.01);
(Continued)

(58) Field of Classification Search
CPC .............. H01L 31/073; H01L 31/0296; H01L 31/0368; H01L 31/1836; H01L 21/02422; H01L 21/02474; H01L 21/02483; H01L 21/02502; H01L 21/02562; Y02E 10/543; Y02P 70/521
See application file for complete search history.

(56) References Cited

U.S. PATENT DOCUMENTS 4,366,336 A     12/1982 Donaghey
5,501,744 A     3/1996 Albright et al.
(Continued)

OTHER PUBLICATIONS

Lyahovitskaya et al., "Low Temperature, Postgrowth Self-doping of CdTe Single Crystals Due to Controlled Deviation from Stoichiometry", Journal of Applied Physics, Oct. 1, 2000, vol. 88, No. 7, pp. 3976-3981.
(Continued)

*Primary Examiner* — Shaun Campbell
(74) *Attorney, Agent, or Firm* — John C. Stolpa; Suzanne C. Walts

(57) ABSTRACT

A method for forming thin films or layers of cadmium telluride (CdTe) for use in photovoltaic modules or solar cells. The method includes varying the substrate temperature during the growth of the CdTe layer by preheating a substrate (e.g., a substrate with a cadmium sulfide (CdS) heterojunction or layer) suspended over a CdTe source to remove moisture to a relatively low preheat temperature. Then, the method includes directly heating only the CdTe source, which in turn indirectly heats the substrate upon which the CdTe is deposited. The method improves the resulting CdTe solar cell reliability. The resulting microstructure exhibits a distinct grain size distribution such that the initial region is composed of smaller grains than the bulk region portion of the deposited CdTe. Resulting devices exhibit a behavior suggesting a more n-like CdTe material near the CdS heterojunction than devices grown with substrate temperatures held constant during CdTe deposition.

23 Claims, 6 Drawing Sheets

(51) Int. Cl.
*H01L 21/02* (2006.01)
*H01L 31/0296* (2006.01)
*H01L 31/0368* (2006.01)
*H01L 31/18* (2006.01)

(52) U.S. Cl.
CPC .... *H01L21/02483* (2013.01); *H01L 21/02502* (2013.01); *H01L 21/02562* (2013.01); *H01L 31/0296* (2013.01); *H01L 31/0368* (2013.01); *H01L 31/1836* (2013.01); *Y02E 10/543* (2013.01); *Y02P 70/521* (2015.11)

(56) References Cited

U.S. PATENT DOCUMENTS

| | | | |
|---|---|---|---|
| 5,578,502 | A | 11/1996 | Albright et al. |
| 5,994,642 | A | 11/1999 | Higuchi et al. |
| 6,423,565 | B1 | 7/2002 | Barth et al. |
| 6,444,899 | B2 | 9/2002 | Kubota et al. |
| 6,521,823 | B2 | 2/2003 | Kubota et al. |
| 6,906,253 | B2 | 6/2005 | Bauman et al. |
| 7,635,647 | B2 | 12/2009 | Johnston |
| 7,704,352 | B2 | 4/2010 | Lopatin et al. |
| 7,901,975 | B2 | 3/2011 | Chen |
| 8,039,290 | B2 | 10/2011 | Feldman-Peabody et al. |
| 8,187,555 | B2 | 5/2012 | Reed et al. |
| 8,198,117 | B2 | 6/2012 | Leidholm et al. |
| 8,232,134 | B2 | 7/2012 | Lee |
| 8,247,255 | B2 | 8/2012 | Pavol et al. |
| 9,147,793 | B2 | 9/2015 | Gessert et al. |
| 2008/0128019 | A1 | 6/2008 | Lopatin et al. |
| 2009/0242029 | A1* | 10/2009 | Paulson ............ C23C 14/0629 136/260 |
| 2010/0012188 | A1 | 1/2010 | Garnett |
| 2010/0126580 | A1 | 5/2010 | Farrell et al. |
| 2010/0212725 | A1 | 8/2010 | Barth et al. |
| 2010/0212740 | A1 | 8/2010 | Barth et al. |
| 2011/0139249 | A1 | 6/2011 | Garnett et al. |
| 2011/0146788 | A1 | 6/2011 | Korevaar et al. |
| 2011/0259424 | A1* | 10/2011 | Basol ............... H01L 21/02422 136/260 |
| 2012/0027922 | A1 | 2/2012 | Pavol |
| 2013/0183793 | A1* | 7/2013 | Sampath .......... H01L 21/02562 438/95 |
| 2014/0261688 | A1* | 9/2014 | Allenic .............. H01L 31/0296 136/260 |

OTHER PUBLICATIONS

Heisler et al., "CdTe Grown Under Cd/Te Excess at Very Low Temperatures for Solar Cells", Journal of Applied Physics, 2013, vol. 113, pp. 224504-1-224504-6.

Enzenroth, R.A., et al., "Transient ion drift measurements of polycrystalline CdTe PV devices," Presented at the 2006 IEEE WCPEC, May 2006, pp. 449-452.

Albin, D.S., "Accelerated stress testing and diagnostic analysis of degradation in CdTe solar cells," Presented at the Proceedings of SPIE Optics+Photonics Meeting, Reliability of Photovoltaic Cells, Modules, Components and Systems, vol. 7048, San Diego, CA, Aug. 10-14, 2008.

Albin, D.S., et al., "Film thickness and chemical processing effects on the stability of cadmium telluride solar cells, " Thin Solid Films, vol. 515, Issue 4, Dec. 4, 2006, pp. 2659-2688.

Albin, D.S., et al, "Precontact surface chemistry effects on CdS/CdTe solar cell performance and stability," Proceedings of the 28th IEEE PVSC, Sep. 15-22, 2000, pp. 583-586.

Demtsu, S., et al., "Stability study of CdS/CdTe solar cells made with Ag and Ni back-contacts," Solar Energy Materials and Solar Cells, vol. 90, Issue 17, Nov. 6, 2006, pp. 2934-2343.

Albin, D.S. et al., "Perturbation of copper substitutional defect concentrations in CdS/CdTe heterojunction solar cell devices," MRS Proceedings, Mat. Res. Soc. Symp. Proc., vol. 719 Spring 2002, pp. 383-388.

Rose, D.H., et al., "Fabrication procedures and process sensitivities for CdS/CdTe solar cells," Progress in Photovltaics: Research and Applications, Apr. 7, 1999, pp. 331-340.

* cited by examiner

VARYING CADMIUM TELLURIDE GROWTH TEMPERATURE DURING DEPOSITION TO INCREASE SOLAR CELL RELIABILITY

RELATED APPLICATIONS

This application claims the benefit of U.S. Provisional Application No. 61/705,546, filed Sep. 25, 2012, which is incorporated herein in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Solar cells are devices that have characteristics that enable them to convert the energy of sunlight into electric energy. The aim of research often is to achieve solar cell designs and manufacturing methods that are suitable for inexpensive commercial production while providing acceptably high energy conversion efficiencies for the solar cells. A further driving force is how to provide improvements in solar cell reliability, e.g., less degradation in the cell when strained or placed into use, which may be thought of as providing a solar cell that is more stable in its functionality over time.

More generally, thin-film photovoltaic (PV) devices may be used to create solar cells, detectors, electronic devices, telecommunication devices, charge-coupled imaging devices (CCDs), computers, and even biological or medical devices (together considered "thin-film compound semiconducting materials"). With regard to renewable energy, solar cells are devices that have characteristics that enable them to convert the energy of sunlight into electric energy. The aim of research often is to achieve solar cell designs with the lowest cost per watt generated by the solar cell, and, concurrently, the designs should provide solar cells that are suitable for inexpensive commercial production and also provide solar cells with improved reliability.

The potential market for thin-film photovoltaic (PV) devices is enormous and is expected to continue to grow in the coming years. Recently, a goal was set to globally deploy one terawatt of continuous PV-based power, and achieving this goal will require an industry that can supply on the order of 300 to 400 GWp (gigawatt peak) of PV modules each year. Additionally, in the United States, goals concerning costs have been set that include a module-level cost goal for utility-scale PV installations of 0.5 $/Wp, which would make unsubsidized PV competitive with conventional power sources. At this cost level and at a deployment level in the hundreds of GWp per year, PV module sales globally may be in excess of $50 billion (in U.S. dollars) per year. As will be appreciated, any technology that can better enable the PV industry, such as by increasing efficiencies, reducing material costs, lowering manufacturing expenses, and the like, has a large potential for growth and revenue generation.

A conventional thin-film solar cell is composed of a stacking of thin layers (e.g., 0.1 to 2 microns thick) on a substrate, and the thin layers form one or more junctions with differing band gaps that absorb light and convert it into electricity. Presently, most commercially available thin-film solar modules are fabricated with an absorber or absorber layer formed of cadmium telluride (CdTe), which has high optical absorption coefficients and have versatile optical and electrical characteristics.

Cadmium telluride (CdTe) photovoltaics is a term that describes a photovoltaic (PV) technology that is generally based on the use of a CdTe thin-film absorber layer in a device that converts sunlight into electricity. There is an ongoing and even growing interest in the use of CdTe in solar cells and solar panels because CdTe thin films are one of the only thin films to surpass crystalline silicon PV technology in providing lower $/W devices for the PV market including multi-megawatt systems. CdTe thin films are attractive in part because they can be deposited very rapidly upon a glass substrate to provide large PV panels (e.g., a panel with a width limited by a deposition tool but a length often only limited by structural concerns for the substrate) rather than being grown as single crystal devices. However, the reliability of CdTe thin films continues to be a concern within the solar power industry, and researchers continue to search for ways to improve this limiting factor associated with use of CdTe thin films in solar cells.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

A method is provided for forming thin films of CdTe (or the CdTe layer) for use in photovoltaic modules (e.g., solar cells). The method includes varying the substrate temperature during the growth of the CdTe layer such as by preheating a substrate (e.g., a substrate with a cadmium sulfide (CdS) heterojunction or layer) suspended over a CdTe source to remove moisture (e.g., to a relatively low preheat temperature) and then only directly heating the CdTe source, which in turn indirectly heats the substrate upon which the CdTe is deposited.

The method has been demonstrated to improve the resulting CdTe solar cell reliability. The resulting microstructure exhibits a distinct grain size distribution such that the initial region or portion is composed of smaller grains than the bulk region or latter portion of the deposited CdTe. Resulting devices such as solar cells exhibit a behavior suggesting a more n-like CdTe material near the CdS structure or heterojunction than similar devices grown with substrate temperatures held constant during CdTe deposition or during growth. The devices fabricated using the CdTe deposition method also show considerably higher minority carrier lifetimes relative to devices grown under constant or fixed substrate temperatures. Higher minority carrier lifetimes are fundamentally necessary for exceeding state-of-the-art device performance.

The new thermal profile used for the CdTe deposition is not typical of laboratory growth experiments or module deposition environments where a single substrate temperature is maintained. Instead, it involves intentionally and deliberately varying the CdTe growth temperature during the CdTe deposition step. In brief, the first layer or region/thickness of the CdTe film is grown at lower temperatures than the final layer or region/thickness.

Use of the indirect heating of the substrate technique improves the intrinsic CdTe cell reliability. Capacitance-voltage (C-V) data has confirmed that the CdTe deposited during the first step or period of deposition is more compensated, likely with Cd interstitials. This reduces diffusional processes within the CdTe, which otherwise would undesirably increase the ability of the CdTe to undergo changes during product application as a solar cell. Further, the CdTe film provides a smaller grain region proximate to or near the junction and a larger grain region proximate to or at the back contact. This limits diffusional processes at the interface/junction, which correspondingly reduces either reaction products or by-products. This effect has been shown using Time-of-Flight Secondary Ion Mass Spectrometry (ToF SIMS) for diffusion of copper (Cu) into the CdS region. The result is a PV module or cell with a more resilient structure or, in other words, a more reliable and stable cell.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

Figure 1:
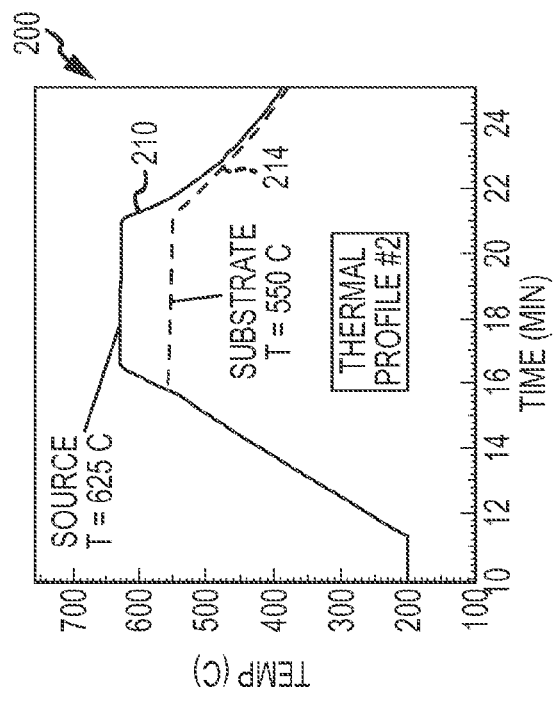
FIG. 1 is a graph of a CdTe deposition process in which both a CdTe source and a suspended substrate are both heated by separate, dedicated heat sources/lamps to predefined deposition temperatures.
Figure 2:
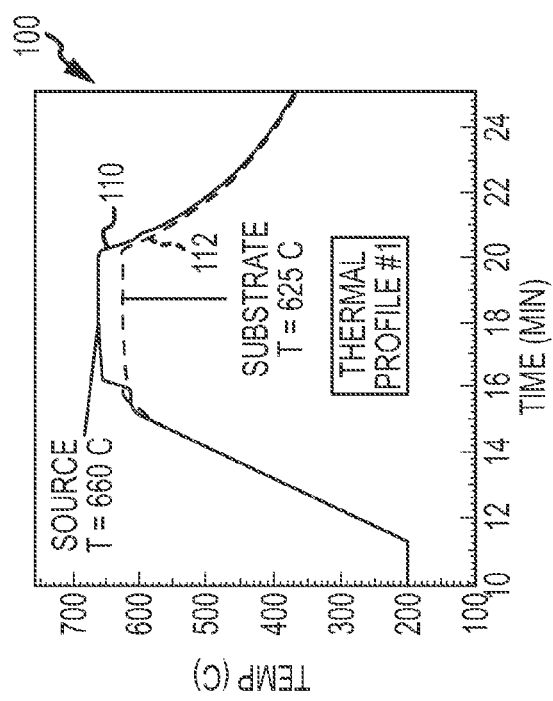
FIG. 2 is graph similar to that of FIG. 1 showing temperatures during another CdTe deposition process with use of a lower substrate temperature.
Figure 3:
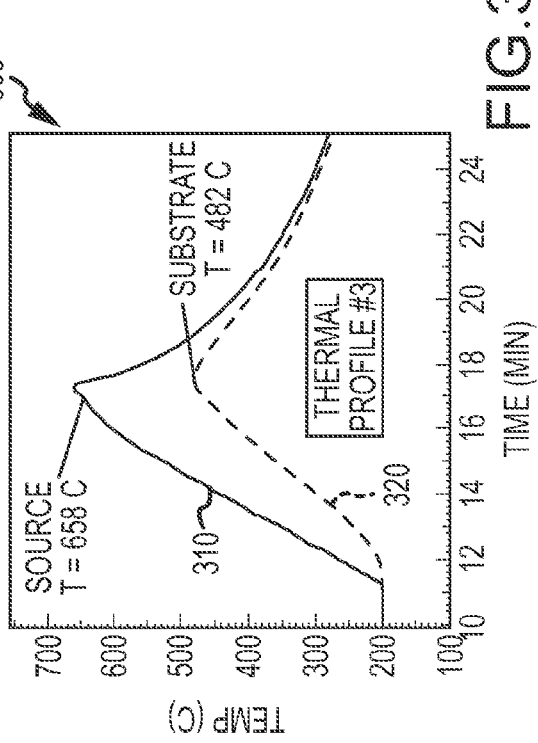
FIG. 3 illustrates a graph similar to FIGS. 1 and 2 showing a third or new thermal profile for depositing or growing CdTe with temperatures shown for the CdTe source and the substrate or surface/component upon which the CdTe is deposited.
Figure 6:
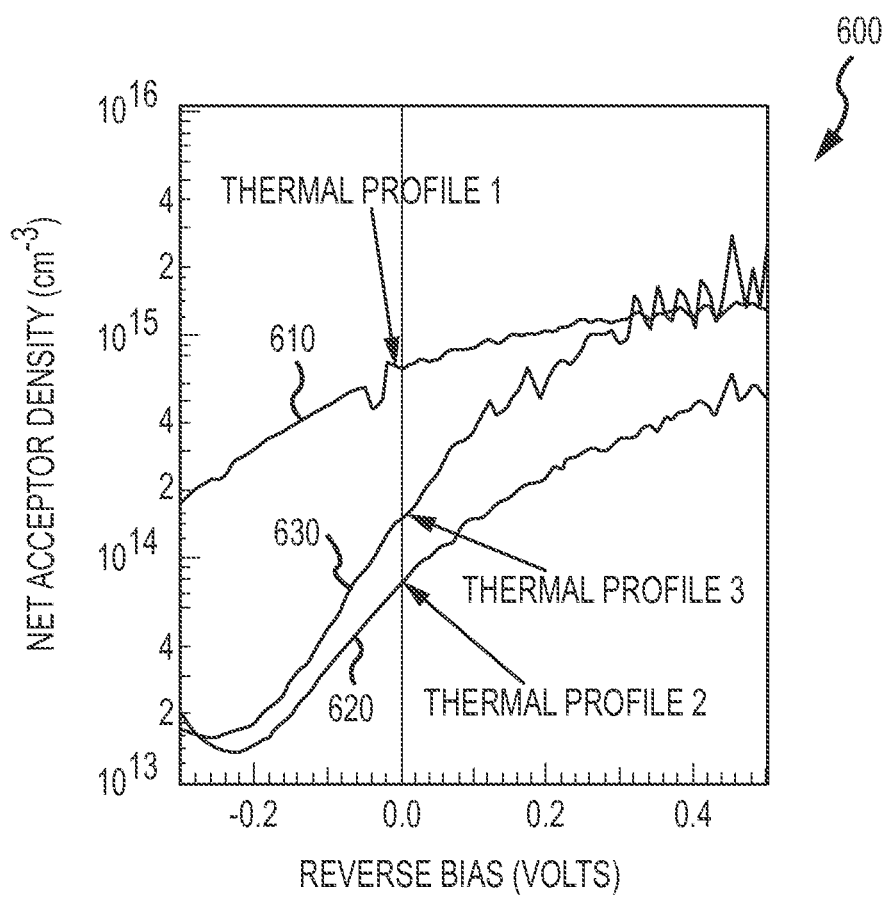
Figure 7:
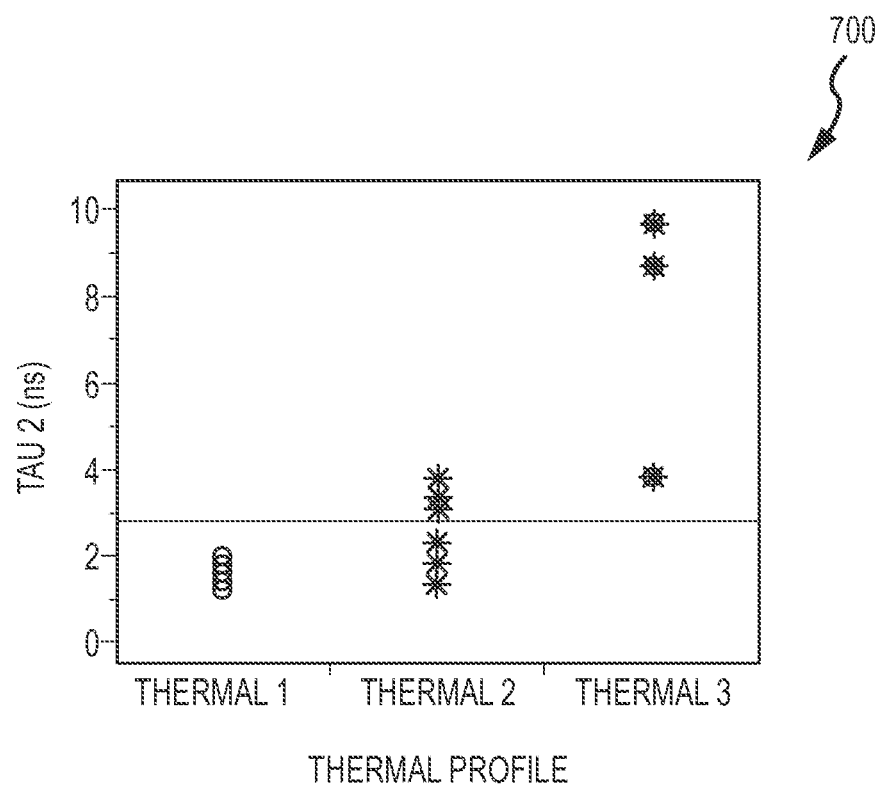
Figure 8:
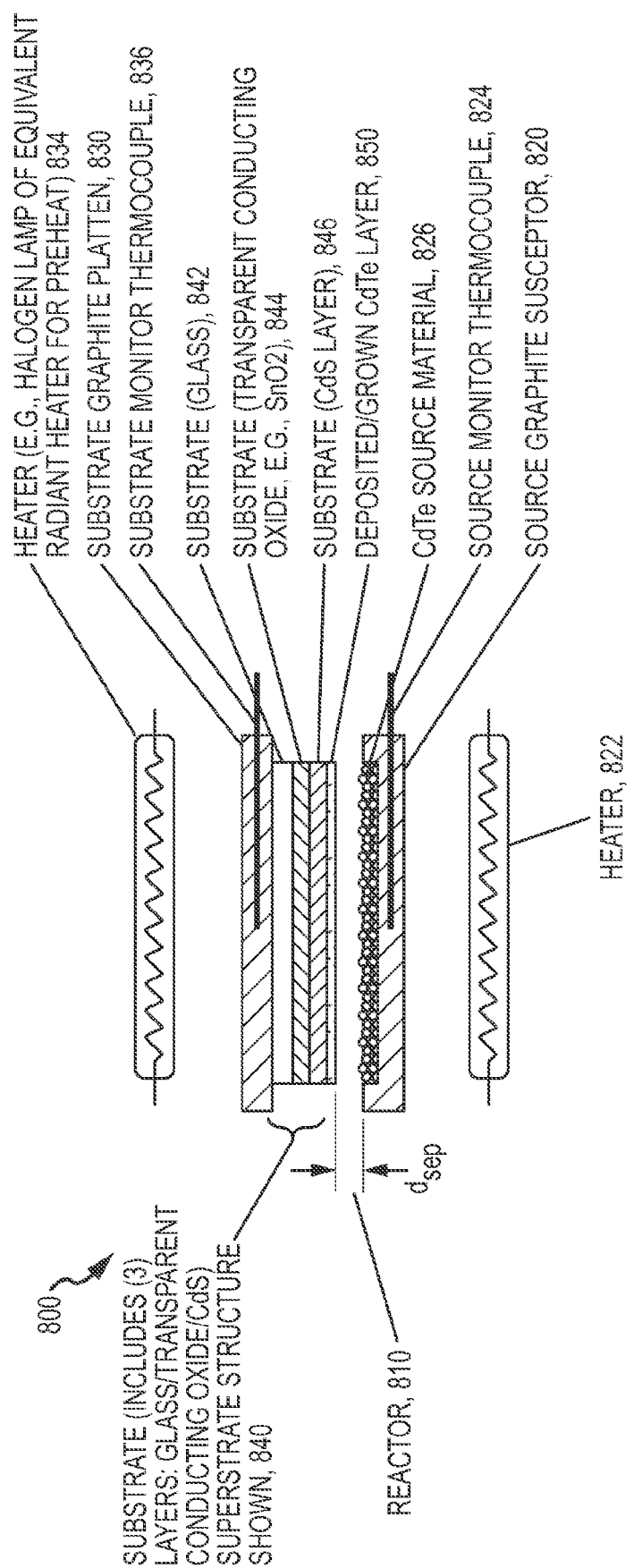
Figure 9:
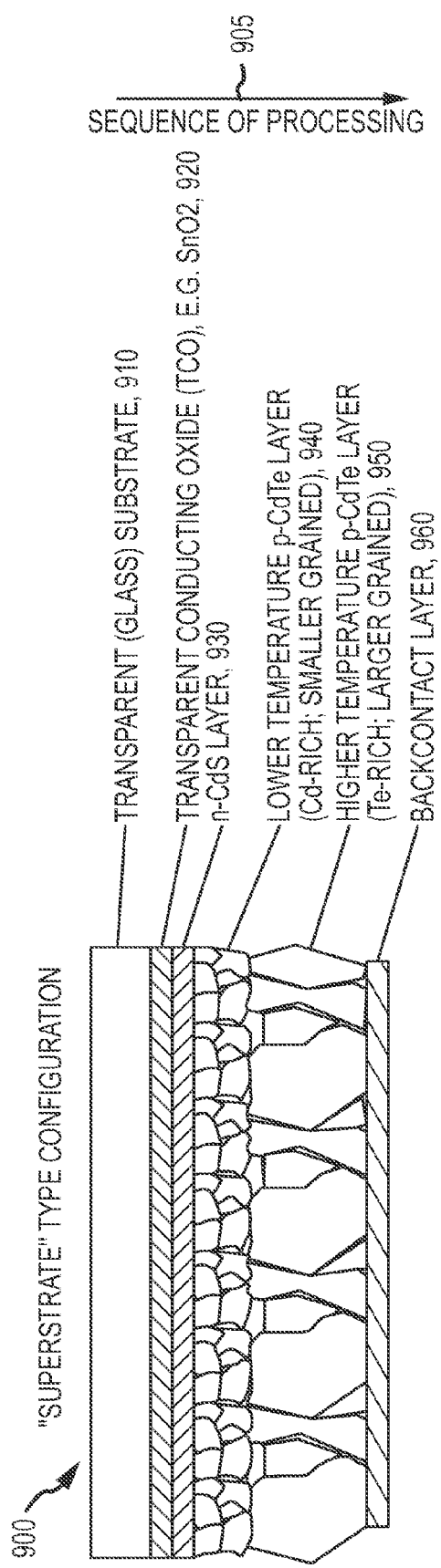
Figure 10:
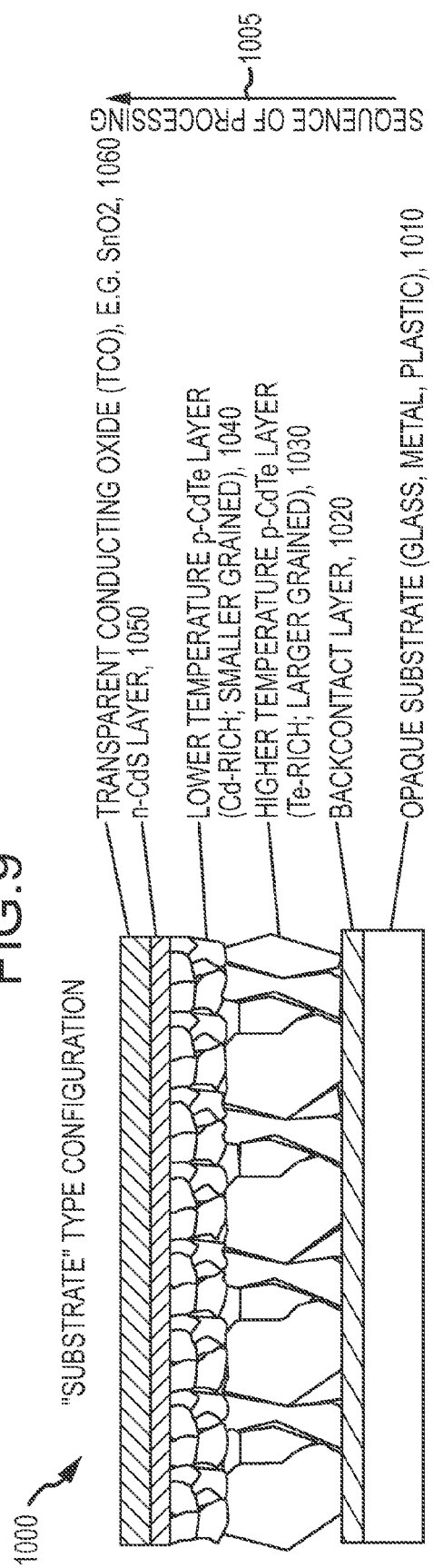

FIG. 6 provides a graph of net acceptor density versus reverse bias showing C-V data for cells formed using the first, second, and third thermal profiles of FIGS. 1, 2, and 3, respectively;

FIG. 7 provides a graph of time-resolved photo-luminescence decay lifetime (TRPL) determinations of carrier lifetime for cells corresponding to cells formed using the first, second, and third thermal profiles of FIGS. 1, 2, and 3, respectively;

FIG. 8 illustrates a side view, in simplistic/schematic form, of an assembly for use in depositing a CdTe layer or thin film according to the present description (e.g., using the thermal profile of FIG. 3); and FIGS. 9 and 10 illustrate cross sections of cells formed using the CdTe deposition techniques described herein (e.g., use of the thermal profile of FIG. 3) with FIG. 9 showing deposition on a superstrate and FIG. 10 showing deposition on a substrate.

DESCRIPTION

The following description is directed generally to a method of fabricating solar cells with a CdTe thin film or absorber with enhanced reliability. Briefly, the manufacturing method involves purposely allowing the CdTe growth rate to vary during deposition of the thin film so as to provide a gradation from a smaller grain region to a larger grain region within the CdTe thin film.

This result may be achieved by using a lower substrate temperature (or range of such lower temperatures) during initial CdTe deposition to form smaller average grains in the portion of the film within or proximate to the cell junction (formed on a film of CdS or the like) transitioning to a higher substrate temperature (or range of higher temperatures) during later or secondary CdTe deposition to form larger average grains in the bulk portion of the film spaced apart from the junction and near or at the back contact.

The temperature control may be provided by preheating the substrate under vacuum to remove moisture and then providing additional heat to the substrate by heating the CdTe source/susceptor. In this manner, the substrate is not directly heated to a uniform deposition temperature as in prior fabrication processes but may be, instead, only heated using radiant heat from the CdTe source. In some cases, though, the substrate is heated to a lower pre-heat temperature directly with heat lamps or other heat sources with increasing temperatures produced by the heating of the CdTe source.

The following discussion provides an explanation of the development of this deposition technique. This groundwork and overview information is followed by a description including specific examples of implementations or uses of this new deposition in forming CdTe thin films and solar cells with a CdTe thin film having non-uniform grain sizes (e.g., smaller grain regions and larger grain regions).

First, there was an understanding by the inventors that CdTe growth rates and grain sizes in the CdTe thin film can play a role in improving cell stability. The inventors' research began to involve use of capacitance-voltage (C-V) measurements in an attempt to better understand cell degradation. In one publication, the inventors specifically correlated changes in C-V transient behavior with both degradation in $V_{OC}$ and fill factor (FF) and, further, postulated that degradation was occurring by a combination of Cu diffusion and the resulting increase in recombination at the interface. Two understandings were developed by the inventors during their research. First, at low substrate temperatures (or simply "T"), one can expect a tendency for Cd-rich growth. This will tend to make films n-type either through a reduction in $V_{Cd}$ (i.e., cadmium vacancies) or an increase in $Cd_i$ (i.e., Cd interstitials). These can block the primary diffusion paths of Cu (bulk) but not necessarily the grain boundaries. Second, at high T, there is a tendency for Te-rich growth. This will increase the likelihood for films to be more p-type either through an increase in $Cu_{Cd}$ (i.e., Cu substitutional defects on Cd sites) or $Te_i$ (i.e., Te interstitials). This structure or film configuration is more open for diffusion of Cu.

These understandings regarding CdTe films were confirmed by the inventors under controlled experimental conditions. Particularly, it was confirmed that the defect chemistry of CdTe films (e.g., resulting from variations in how the CdTe films were grown) affects the ability of these cells to resist degradation during subsequent CdTe accelerated lifetime testing (ALT), i.e., affects cell reliability. The inventors also understood that variations in CdS/CdTe cell fabrication systematically affect cell reliability and that particular defect chemistries resulting from variations in back contact processing (confirmed by admittance spectroscopy) affect cell reliability.

From this and other results, the inventors continued to believe that modifying the CdTe growth conditions likely would result in a more reliable CdTe photovoltaic product. Particularly, it was believed that this control over CdTe growth in the CdTe layer/film could be accomplished by specifically tailoring the defect chemistry depending upon the location (thickness) in the CdTe layer. This built on the concepts discussed above regarding Cu diffusion and that growth conditions favoring Cd vacancies ($V_{Cd}$) at the back surfaces (portion of film spaced apart or distal to the junction) would be beneficial for cell reliability as it would favor Cu substitutional ($Cu_{Cd}$) defects. These beliefs are further supported by the concept that growth conditions favoring Cd interstitials ($Cd_i$) at the interface or junction would be beneficial to cell reliability as they would impede Cu diffusion into that region. Interestingly, phase diagram result from researchers such as Lyahovitskaya et al. [JAP 88 17 3976-81 (2001)] may be used to support the argument that lower temperatures during deposition of the CdTe film favor Cd-rich stoichiometries, but this approach is opposite to the Cd-deficient stoichiometries as was the case for high temperature processes in use at the time of the inventors' research.

Experiments were then performed using a new thermal profile (for the substrate) that was developed by the inventors specifically to emphasize lower temperature and faster CdTe growth by close-spaced sublimation. CdS/CdTe devices (solar cells) were completed or fabricated using these new CdTe thin films. The thin film fabrication process may be considered a high growth rate (or HGR) process to emphasize the high deposition rate of these films. For example, typical CSS processes may operate at about 1 μm/min while the high growth rate processes described herein may provide much higher deposition rates such as 4 μm/min to 10 μm/min or higher.

Testing also showed that the thin films grown by the methods taught herein exhibit unusually and unexpectedly high minority carrier lifetimes as measured by TRPL. Hence, the fabrication process has also been labeled a high lifetime (HLT) process. Higher lifetimes are generally believed to be advantageous for enhanced performance since higher lifetime should improve the ability to collect electron-hole pairs generated by solar irradiance deep within the CdTe film, which desirably results in increases in both $V_{OC}$ and FF.

The HGR/HLT cells (i.e., solar cells with a CdTe thin film grown as taught herein to have a smaller grain region and a larger grain region by using differing substrate or film deposition temperatures) have been shown to exhibit considerably improved cell reliability when subjected to accelerated stress tests, which may be surprising or at least unexpected in the amount of improvement achieved when considering conventional manufacturing practices. For example, based on test results, the HLT/HGR cells have higher lifetimes and show a strong and statistically significant improvement in their ability to resist degradation during stress testing.

To produce these enhanced cells, the solar cell fabrication techniques described herein include a method or process of forming the CdTe thin film. The thin film forming or deposition process includes one or more steps or techniques for controlling the temperature (i.e., the substrate (or superstrate) temperature) during the CdTe deposition process or step. Briefly, a CdTe film or absorber may be deposited by providing a substrate (this term is intended to have a broad meaning to be any entity upon which the CdTe is deposited upon such as a superstrate in which the CdTe absorber is deposited after the transparent conducting oxide (TCO)/CdS layers as well as a substrate configuration in which the CdTe absorber is deposited before the TCO/CdS layers of the solar cell/PV device). The substrate is suspended a short distance (e.g., 1 to 10 mm with smaller separation distances providing greater thermal coupling to the CdTe source) over a CdTe source (i.e., the entity or component providing the CdTe that will be transported to the exposed substrate surface). In the present process, typically only the CdTe source is heated with the suspended substrate only being heated by the radiant heat from the CdTe source (although the substrate may first be preheated to assist in removal of moisture). In other embodiments, though, the substrate may also be heated, but, typically, to temperatures below a thermal equilibrium temperature of the system.

This method is in contrast to CdTe deposition processes that heat both the source and the substrate to pre-determined and closely controlled temperatures (i.e., within a tight temperature band/range about a single set point temperature). For example, the source and substrate may be nominally heated to temperatures of 660° C. and 620-625° C., respectively, which are the heater or equipment control temperatures used in deposition of the CdTe film. The actual temperatures (e.g., as measured by thermocouple) may vary somewhat, but heating rates are typically adjusted during deposition such that the control and actual temperatures are nearly identical in practice.

For example, FIG. 1 illustrates an exemplary CdTe deposition process with graph 100 in which both the CdTe source and the suspended substrate are heated by heat sources (e.g., heat lamps dedicated to each component). In graph 100, the thermocouple-monitored source temperature is shown with line 110 and the thermocouple-monitored substrate temperature shown with line 112. Deposition occurs once the CdTe source reaches about 600° C. such that the deposition occurs in the process shown with graph 100 from about 15 minutes to 21 minutes. The substrate temperature is held generally constant at 625° C. and the source at 660° C. during this deposition of CdTe (or growth of CdTe), and this uniform substrate temperature during the deposition time period provides a relatively larger grain size throughout the CdTe thin film. The graph 100 may be considered as showing a first thermal profile for the source and the substrate during a standard close-space sublimation (CSS) CdTe deposition where the equipment source and substrate temperatures are controlled to 660° C. and 625° C., respectively.

FIG. 2 illustrates another exemplary CdTe deposition process with graph 200. Again, both the source and the substrate are heated by separate, dedicated heaters (e.g. heat lamps or the like) as shown with lines 210 and 214, respectively. In this case, experiments were being used to investigate the use of lower substrate temperatures (i.e., the CdTe deposition temperature shown with line 214 after the source has reached a temperature of about 625° C.). As shown in graph 200, the equipment control temperatures were adjusted accordingly such that the control and actual (thermocouple) temperatures were again similar. During deposition (i.e., from time 16 minutes to about time 21 minutes), the source was maintained at 625° C. while the substrate was held at 550° C. as shown by lines 210, 214. Again, the use of a single substrate temperature provides relatively uniform CdTe grain size in the deposited/grown thin film. Graph 200 can be thought of as providing a second thermal profile that would be used to grow CdTe at a temperature of 550° C. in a standard CSS CdTe deposition.

It was recognized by the inventors that a consequence of the CSS close arrangement between the source and the substrate is a strong thermal coupling. The substrate is thermally coupled to the source due to heating from the source by radiation and convention. The latter is due to the process typically being conducted at a base pressure of around 15 Torr. This heat from the source along with the separate heating being concurrently applied to the substrate can make it difficult to use low substrate temperatures since a minimal source temperature is required to generate adequate CdTe vapor pressure (i.e., a source temperature of 600 to 625° C.), which limits the lower substrate temperature that can be practically achieved when it is separately heated for deposition. Since the inventors recognized that lower substrate temperatures were desirable at least to increase CdTe condensation and deposition rates, the conventional methods of heating both the source and the suspended substrate did not appear to be adequate.

The HLT/HGR process or CdTe thin film deposition process described by FIG. 3 can be quickly contrasted with these two processes and the associated thermal profiles shown in FIGS. 1 and 2. The HLT/HGR process involves heating the substrate without direct heating (other than to provide preheating to remove moisture such as to 200° C.) but, instead, by only heating the CdTe source, which, in turn, heats the substrate. During the heating of the CdTe source, the suspended substrate is positioned a separation distance (e.g., 1 to 10 mm or more when less thermal coupling is desired) away from the top of the source (or the CdTe material in an open dish/tray) that is chosen so as to allow or provide thermal coupling (e.g., radiative thermal coupling) between the source and substrate to effectively heat the substrate via the source.

FIG. 3 illustrates with graph 300 a resulting or third thermal profile of the HLT/HGR process with line 310 representing the thermocouple-monitored source temperature over time while line 320 represents the thermocouple-monitored substrate (or CdTe deposition/growth) temperature over time. As discussed above, deposition occurs generally after the source reaches a temperature over about 600° C. or, as shown, after about 16 minutes (in this non-limiting example). Hence, deposition may occur from a time after 16 minutes until about 18 minutes. Neither the source nor substrate is maintained at a temperature plateau during deposition. Over this time period, line 320 shows that the substrate has a much lower temperature than the source at the start of deposition (at 16 minutes) such as about 350 to 400° C. and during later deposition the substrate temperature has significantly increased to a range of 450 to 500° C. In other words, the process represented by graph 300 involves deposition or grain growth of CdTe at varying temperatures or, more accurately, over differing temperature ranges such that grain size differs depending on when deposition occurred in the CdTe thin film. The thermal profile of graph 300 may be defined with line 320 showing a deposition start substrate temperature (e.g., about 400° C.) and a peak substrate deposition temperature (e.g., about 480° C. with 482° C. shown in the graph 300).

FIG. 3 shows an actual thermal profile with graph 300 for one experiment for the source (line 310) and the substrate (line 320). Temperatures were measured during the HGR (or HLT) process, and, during this deposition process, only the equipment source temperature was controlled to 660° C. This produced a thermal profile in which neither temperature line/profile 310, 320 plateaus but each, instead, reaches a peak or top temperature and then drops off over time, with the peak temperatures being 150 to 200° C. apart (with a difference of 176° C. being shown in this experiment) whereas in the past profiles of FIGS. 1 and 2 the difference was less than 100° C.

The resulting rise in the substrate temperature over time during deposition is due to thermal coupling with the source, which is the only component being heated during deposition (with the graph 300 showing that the substrate and source were both preheated to 200° C. to remove moisture). A quick comparison of the third thermal profile 300 with those of FIGS. 1 and 2 shows that this thermal profile for CdTe deposition is considerably different, which will provide a different CdTe thin film. This is due, in part, to the fact that the actual CdTe growth temperature differs by a significant amount during the CdTe deposition, and, in particular, the CdTe substrate temperature increases during the deposition process from a deposition start temperature (e.g., 350-400° C.) to a deposition peak temperature (e.g., 450-500° C.). Hence, deposition first occurs with the substrate in a first deposition temperature range (e.g., 350 to 450° C.) and then second occurs with the substrate in a second deposition temperature range (e.g., 450 to 500° C., in this example). This causes the CdTe to initially be grown with smaller average grain diameters and then to later be grown with larger average grain diameters or to provide two (or more) grain size regions across the depth of the thin film.

As will be appreciated, the CdTe deposition process associated with the third thermal profile of FIG. 3 effectively results in the CdTe film undergoing a change in growth temperature during deposition. During the initial time of deposition, the substrate temperature is relatively quite low and, at the conclusion of deposition, the temperature is significantly higher (e.g., 10 to 40 percent or more increase in substrate temperature during deposition when the substrate is not actively cooled and is closely coupled thermally such as with a source-substrate separation distance of 1 to 10 mm) but, compared with the thermal profiles of FIGS. 1 and 2, still relatively low. For example, if one were to assume that the vapor pressure of CdTe does not reach an adequate saturation level necessary to condense on the substrate surface until the source reaches a temperature of 600° C., the initial CdTe deposition temperature exhibited in the thermal profiles/processes of FIGS. 1, 2, and 3 would be, respectively, about 600° C., about 550° C., and about 412° C. while the final or peak deposition temperatures would be, respectively, about 625° C., about 550° C., and about 482° C.

The CdTe deposition process was used to produce a set of solar cells, and these cells were determined through testing to be considerably less susceptible to degradation. To explain the achieved increase in cell stability, it may be useful to discuss or present three sets of data. A first set (or "Set 1") includes high temperature CdTe films deposited using the first thermal profile of FIG. 1 (e.g., substrate temperature controlled at 620° C. with a dedicated substrate heater) with thicknesses in the range of 9 to 10 microns. A second set (or "Set 2") includes lower temperature CdTe films deposited using the second thermal profile of FIG. 2 (e.g., a substrate temperature controlled at 550° C. with a substrate heater) with thicknesses in the range of 3.2 to 3.5 microns. A third set (or "Set 3") includes even lower temperature CdTe films deposited using the third thermal profile of FIG. 3 (e.g., with a maximum or peak deposition/substrate temperature of about 480° C., which was not controlled by direct substrate heating) with thicknesses of about 4 microns.

All the devices in this comparison included similar post-CdTe deposition processing conditions associated with cadmium chloride ($CdCl_2$) treatment as well as contacting with the exception that the cells in Set 3 did not undergo a commonly used nitric-phosphoric (NP) acid etch prior to contacting. This is a notable difference that is discussed in more detail below. The change in $V_{OC}$ recorded for cells from Sets 1 and 2 that were stressed at a temperature of 100° C. is shown with graphs 410 and 420 of FIGS. 4A and 4B. Graph 410 shows the recorded changes in $V_{OC}$ while graph 420 shows the recorded percentage $V_{OC}$ change for cells from Set 1 (lines with circles) and Set 2 (lines with asterisks).

From these graphed results, the inventors determined that, depending on the method(s) adopted for reducing the substrate temperature in fabricating thinner CdTe devices/cells, there can be significant detrimental impact on cell reliability (or stability). The thinner devices resulting from use of the second thermal profile of FIG. 2 degrade quite readily. In these examples, it should be noted that, in general, reducing the CdTe thickness decreases cell reliability.

To demonstrate the merits of using the third thermal profile 300 of FIG. 3 during CdTe deposition, solar cells were fabricated using the third thermal profile and Set 3 data was compared with Set 1 data (cells fabricated using the first thermal profile). The change in $V_{OC}$ recorded for cells from Sets 1 and 3 that were stressed at a temperature of 60 to 65° C. (stress temperature preferred by the solar energy/cell industry) is shown with graphs 510 and 520 of FIGS. 5A and 5B. Graph 510 shows the recorded changes in $V_{OC}$ while graph 520 shows the recorded percentage $V_{OC}$ change for cells from Set 1 (lines with circles) and Set 3 (lines with asterisks).

Figure 4A:
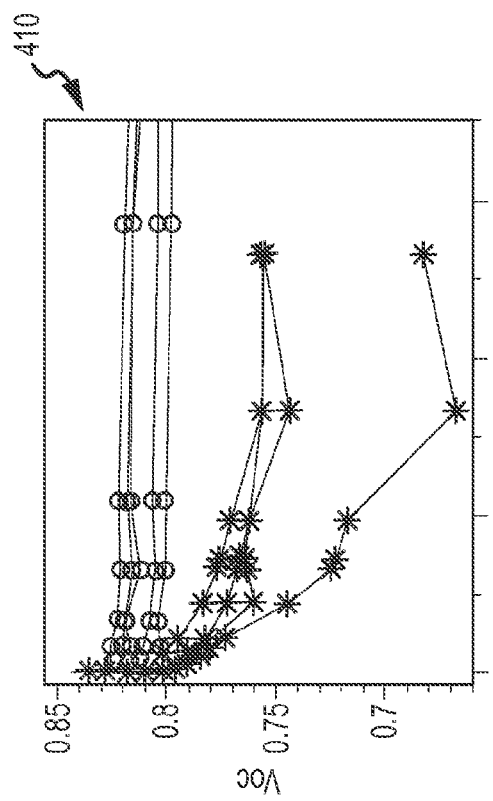
FIGS. 4A and 4B illustrate with graphs change in $V_{OC}$ and percentage $V_{OC}$ change (del$V_{OC}$) that were recorded for cells formed using the profiles of FIGS. 1 and 2 that were stressed at a temperature of 100° C.
Figure 5B:
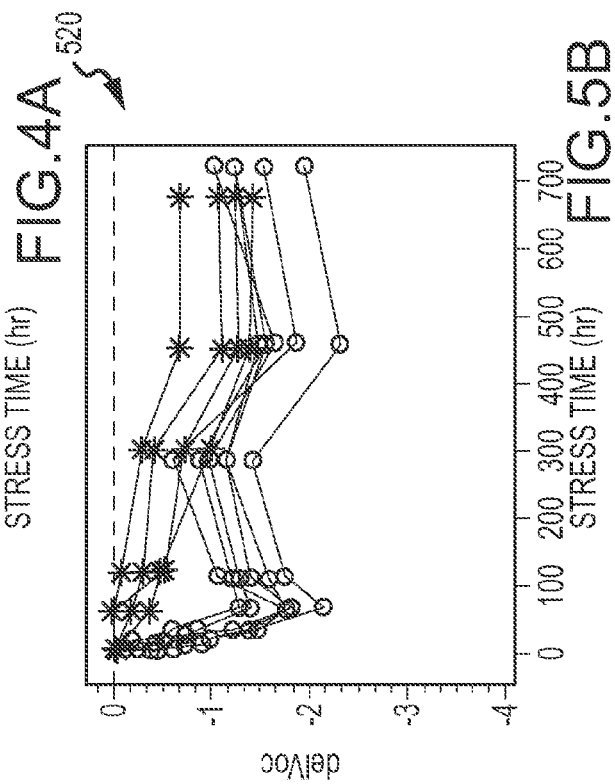
FIGS. 5A and 5B illustrate with graphs change in $V_{OC}$ and percentage $V_{OC}$ change (del$V_{OC}$) that were recorded for cells formed using the profiles of FIGS. 1 and 3 that were stressed at a temperature of 60 to 65° C.
Figure 4B:
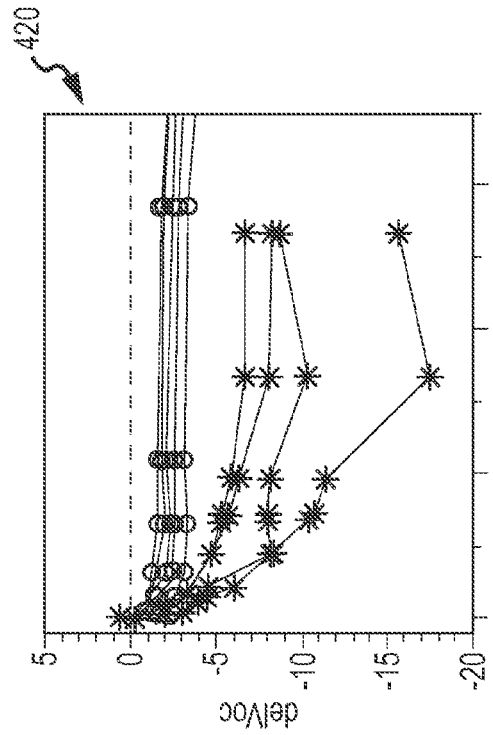
Figure 5A:
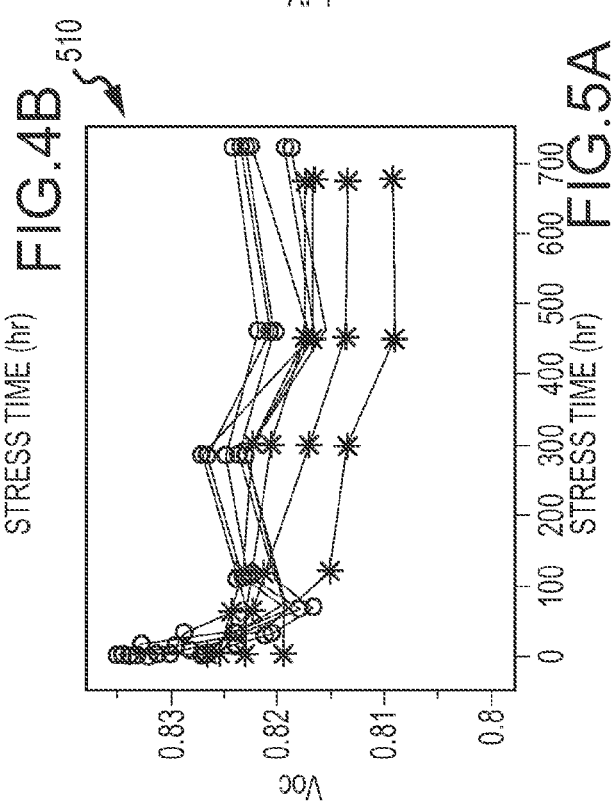

Since the stress temperature was reduced in this case when compared with the graphs of FIGS. 4A and 4B, the overall decrease in $V_{OC}$ is reduced. For example, in this case, the overall decrease in $V_{OC}$ is approximately less than 2 percent relative to the much greater change shown in FIGS. 4A and 4B. An interesting result, however, is that the percent change in $V_{OC}$ observed for Set 3 devices (the third thermal profile cells) is actually less than that which was recorded for Set 1 devices. This is entirely different from the comparison made between Sets 1 and 2, where a decrease in thickness of the CdTe film greatly impacts reliability. In FIGS. 5A and 5B, the opposite result is shown. A similar reduction in thickness in the CdTe film does not introduce a reliability concern for the Set 3 devices/solar cells. Rather, the reliability may even have improved.

As mentioned above, cells in Set 3 were also fabricated without a NP etch. This was done intentionally as to fabricate solar cells that were more representative of a manufacturing environment where such wet etches are often avoided. Additionally, the results achieved and shown by the Set 3 data is encouraging because the NP etch (or some similar etch resulting in elemental telluride forming at the interface between the CdTe and contact) is well known to improve reliability. In other words, use of an NP etch may have further improved the performance of the cells formed with a CdTe thin film provided with the third thermal profile. Prior to performing the stress testing of cell from Set 3, there was concern that cell reliability would suffer due to the absence of NP or similar etch prior to contacting. Instead, this was not the case, and, when compared with the results shown in FIGS. 4A and 4B, there is a demonstrated strategic advantage associated with the use of the third thermal profile of FIG. 3 with reference to cell reliability.

At this point, it may be useful to compare the C-V data and the TRPL data, the latter which is used to measure minority carrier lifetime. With this in mind, FIG. 6 provides a graph 600 of net acceptor density versus reverse bias with lines 610, 620, and 630 providing data for cells formed using the first (100), second (200), and third (300) thermal profiles, respectively. FIG. 7 provides a graph 700 of TRPL-determined minority carrier lifetime for cells corresponding to Sets 1, 2, and 3, respectively.

With reference to FIGS. 6 and 7, if one compares the C-V and TRPL data taken on cells from Sets 1, 2, and 3, differences become apparent that suggest the variation in stoichiometry (which was discussed above). As shown with graph 600 of FIG. 6, the net acceptor density in cells fabricated with the second and third thermal profiles are nearly an order of magnitude less than that measured for cells fabricated with the first thermal profile. It is likely this supports the understanding that lower growth temperatures increase an "n-like" behavior in the first deposited, smaller grain region of the CdTe thin film formed using the third thermal profile, such that the net acceptor density is observed to decrease. As shown with graph 700 of FIG. 7, the increase in lifetime observed when comparing cells formed using first, second, and third thermal profiles (Set 1 to Set 2 to Set 3 data) is due, at least in part, to the lower substrate temperatures used for each thermal profile.

The CdTe deposition process described herein involves the use of the third thermal profile 300 shown by FIG. 3. This profile 300 will produce a CdTe microstructure that is more resilient to stress testing and will increase the reliability of photovoltaic CdTe modules. Use of the third thermal profile is a significant departure from typical experimental deposition and manufacturing processes as relying only upon thermal coupling with the heated CdTe source is not usual. Experimentation typically would call for controlling the substrate closely to a single deposition temperature (where a "single" deposition temperature should be understood to mean a relatively tight temperature range or band about a control temperature used with a substrate heater(s) such as a range of ±10° C. about a set point may be considered a single or set substrate temperature for this discussion).

In actual practice, the fabricated cells using the third thermal profile represent structures where the CdTe near the CdS heterojunction is grown under significantly lower heating conditions relative to the CdTe near the back contact. Subsequent high-resolution scanning electron microscopy (SEM) images using focus ion beam (FIB) prepared samples of the HGR/HLT structures have shown that the grain structure of the CdTe is different than the structure of CdTe deposited using the thermal profiles of FIGS. 1 and 2 where the substrate is held at a single higher temperature during deposition and deposition provides a more relatively larger grain size throughout the thin film.

In direct contrast, for the HGR/HLT cells, the CdTe grain size exhibits more distinct grain size distributions, e.g., a smaller grain region transitioning to a larger grain region. For approximately the first half (or less) of the CdTe film (e.g., half the film thickness or a region proximate to the CdS layer/film of the cell), the grain size is significantly smaller while near the back contact (e.g., half of the film thickness or a region near the back contact) the grain size is significantly larger. For example, it is believed that the grains of the first deposition region or smaller grain region may have a size (e.g., diameter) that is less than 50 percent of the size of the grains in the second deposition region or larger grain region. Depending on the differences in the two temperature ranges (or the deposition start temperature and peak substrate/deposition temperature), the difference in size may be much larger with the smaller grains being 5 to 20 percent the size of the larger grain or even smaller.

FIG. 8 illustrates a side view, in simplistic/schematic form, of an assembly 800 for use in depositing a CdTe layer or thin film according to the present description. For example, the assembly 800 may be operated according to the thermal profile of FIG. 3 to deposit or grow the CdTe layer 850 on the substrate 840. As shown, the assembly 800 includes a reactor 810 that may provide a volume that can be kept at a desired pressure such as at vacuum or the like.

Within the reactor 810 (e.g., a close-spaced sublimation (CSS) reactor), a source (e.g., a source graphite susceptor) 820 may be positioned in a lower portion, and a quantity of CdTe source material 826 is placed in an upper, exposed cavity or bowl of the source 820. A heater(s) 822, such as a halogen lamp or other radiant heater, is provided below or otherwise near the source 820 and is operated during deposition steps/processes to heat the source 820 to a predefined source temperature (e.g., to 600 to 670° C. or the like) as measured for control/feedback by a source monitor thermocouple 824.

The assembly 800 further includes a support 830, such as a substrate graphite platen or the like, positioned in the reactor 810 directly above (and typically parallel to) the source 820. The support 830 is used to retain and position a substrate 840 (shown as a superstrate in FIG. 8) over the source 820 (e.g., the substrate 840 is suspended over the open bowl/cavity of the source 820 such that exposed surfaces receive CdTe during deposition). In this example, the substrate 840 includes, prior to deposition, three layers in the form of a glass layer 842, a transparent conducting oxide (TCO) layer 844 (e.g., $SnO_2$ or the like), and a CdS layer 846. The CdS layer 846, in this example, is exposed to or facing the source 820 such that during deposition a CdTe layer 850 is deposited upon the CdS layer 846.

The substrate 840 (e.g., the CdS layer 846) is positioned a separation distance, $d_{sep}$, apart from the source 820 (e.g., from the top of the source material 826). Typically, this distance, $d_{sep}$, will range from 1 to 10 mm with smaller separation, such as 1 mm, being used to provide greater thermal coupling between the source 820 and the substrate 840. Thermal coupling is sometimes desired because during deposition processes or operations of assembly 800 the heater 822 is typically the only source of heat for heating the substrate 840. For some embodiments, at least one additional heater 834 is provided in the assembly 800 and is operated to preheat the substrate 840 via platen 830 to a baseline temperature before deposition, with the temperature being monitored for control of heater 834 via thermocouple 836.

In some cases, the heater 834 is also operated during deposition to maintain a desired range of substrate temperatures that are significantly lower than the temperature of source 820. That is, in many applications or uses of assembly 800, the heater 834 is set at a preheat temperature, while deposition/substrate temperatures for deposition/growth as defined by the third thermal profile are controlled by heating the source 820 with heater 822 and using heat released (radiant and convective heating) from the source 820 to heat the substrate 840. Exemplary deposition processes are discussed below and may be used to control operation of the assembly 800 to provide a thin film or layer of CdTe 850 that has a smaller grain region near the CdS layer 846 and a larger grain region more distal to the layer 846 (e.g., near a later provided/applied back contact).

FIGS. 9 and 10 illustrate cross sections of cells formed using the HLT/HGR CdTe deposition techniques described herein (e.g., use of the thermal profile of FIG. 3). FIG. 9 shows a typical superstrate configuration 900 in which the CdTe absorber is deposited after the TCO/CdS layers while FIG. 10 shows a substrate configuration 1000 in which the CdTe absorber is deposited before the TCO/CdS layers. For some embodiments, the configurations 900 and 1000 are produced using an assembly such as, for example, assembly 800.

In the cell/module 900, a transparent substrate or layer (glass layer) 910 is provided and processing/deposition proceeds from this layer 910 as shown with arrow 905. Particularly, a TCO layer 920 followed by CdS layer 930 are deposited or provided on the transparent substrate 910. These three layers 910, 920, 930 may be considered the "substrate" or "superstrate" upon which the CdTe is grown according to the present description.

Using the third thermal profile, the processing 905 continues for structure/cell 900 to form a layer or film of CdTe made up of a smaller grain region 940 on the CdS layer 930 and then a larger grain region 950 distal to the CdS layer 930 (or near contact 960). In processing 905, the substrate (layers 910-930) is initially at a lower temperature or in a first deposition temperature range that produces the lower temperature, n-like CdTe layer 940, which is Cd-rich and, as shown, is small grained relative to the later deposited/grown CdTe 950. Next, in the processing 905, the substrate (layers 910-940) is at a temperature greater than the first lower, deposition temperature or in a second deposition temperature range that produces the higher temperature, p-like CdTe layer 950, which is Te-rich and, as shown, is large grained relative to the earlier deposited/grown CdTe 940. The processing 905 continues with applying a back contact layer 960 on the larger grain region or layer 950.

In structure or cell 1000, an opaque substrate 1010, such as a layer of glass, metal, plastic, or the like, is provided and processing proceeds as shown with arrow 1005. A back contact layer 1020 is formed on the substrate layer 1010. This "substrate" of layers 1010, 1020 is at a higher (or second) deposition temperature or within a temperature range as defined by the third thermal profile that produces, as shown, the larger grain region 1030 of the CdTe layer or film. Next, the substrate of layers 1010, 1020, and 1030 is reduced in temperature or "initial" deposition temperature range as defined by the third thermal profile to produce, as shown, the smaller grained region 1040 of the CdTe layer or film. Next, the processing 1005 involves applying a CdS layer 1050 on the smaller grained CdTe 1040 and then a TCO layer 1060 to complete the cell/module 1000.

The following provides a description of one useful and exemplary (but not limiting) close-spaced sublimation (CSS) of a CdTe process or fabrication method that may be used to implement the concepts discussed above to provide useful cells or modules with CdTe films with two regions with differing grain sizes. As a first step, the method may include preparing a substrate structure prior to the CSS of CdTe. In some implementations, the substrate structure is a superstrate type substrate that includes glass/TCO/CdS, where the TCO is transparent conducting oxide such as $SnO_2$. In other implementations, the substrate structure is a substrate type that includes a rigid material (e.g., glass, metal, or plastic film) that is coated with a metallic conducting back contact. The following discussion, for simplicity of explanation, describes deposition on a substrate of the superstrate type.

A second or next step of the method may include positioning the substrate above a susceptor containing a source of CdTe. A platen of similar material to that used to contain the CdTe is positioned on top of the substrate structure. If heated by radiative heating, both the platen and the susceptor may be made of a material such as graphite, which is typically coated with a layer of pyrolitic carbon to make it more resistant to oxidizing ambient.

As a third or next step of the method, the combination of the substrate structure, the CdTe source material susceptor, and the substrate platen are positioned in a reactor with monitor thermocouples embedded in the graphite pieces. If radiant heat is used to provide heating with external lamps or the like, the reactor may be formed using quartz or the like. As a fourth step, the reactor may be evacuated and then backfilled with an inert atmosphere (e.g., nitrogen ($N_2$), argon (Ar), helium (He), or the like). As a next or fifth step, the method may include evacuating the reactor again and then backfilling the reactor with $H_2$ to help remove chemisorbed moisture from the reactor. A sixth or later step may involve cycle purging the chamber of the reactor with hydrogen ($H_2$) several times to insure that all air and moisture is removed from the reactor. During the last cycle purge, the reactor is typically left under vacuum.

As a seventh or next step, the method may include using heating elements to heat the substrate and source platen and susceptor to a preheat temperature (e.g., 200° C.). In this way, parts of the reactor are held at this temperature for a predefined time, such as 10 to 15 minutes, so as to remove additional moisture from the reactor. As an eighth or next step, near the end of this anneal (200° C. anneal), oxygen is introduced into the reactor to a pressure of between 0.1 and 2.0 Torr (e.g., 1.0 Torr nominal in some cases). Then, an inert gas (e.g., $N_2$, Ar, He, or the like) is introduced such that the total reactor pressure is between about 1 and 20 Torr (e.g., 15 Torr nominal in some cases).

After the anneal step, a ninth or next step involves raising the temperature of the source graphite susceptor to a temperature between about 600 and 700° C. (e.g., 660° C. nominal in some cases) such as in about 5 to 10 minutes (e.g., 6 minutes nominal). The substrate graphite platen is not intentionally or directly heated, but it instead is allowed to rise in temperature due to being thermally coupled to the source graphite susceptor. In other words, the substrate heater is not operated further to heat the substrate graphite platen from this point in the process. The thermal coupling is a function of: the inert gas used in the reactor (e.g., He increases coupling while $N_2$ decreases coupling); the distance between the bottom source graphite susceptor and the top substrate graphite platen (e.g., 1 to 3 mm nominal though greater distances may be useful to further reduce coupling when film thickness uniformity is not critical); and the total reactor pressure (e.g., lower pressures will decrease thermal coupling but also increase deposition rate).

A next or tenth step of the method may include operating the heater to provide a nominal source graphite susceptor temperature rise of 77° C./minute from 200° C. to a maximum/peak temperature of approximately 660° C. such that the corresponding substrate graphite platen experiences a temperature rise from 200° C. to 480° C. at a rate of about 47° C./minute. A source graphite susceptor temperature of at least approximately 600° C. is generally needed to achieve saturation conditions necessary for CdTe deposition on the substrate. At the point that the CdTe source reaches 600° C., the substrate graphite platen temperature is at about 400° C. At the point that the CdTe source reaches 660° C., the substrate graphite platen temperature is about 480° C. though the condensed CdTe film is believed to be somewhat hotter since the CdTe surface has a high emissivity and will attempt to equilibrate with the CdTe source material temperature. In this fashion, the region or portion of the CdTe film nearest the CdS surface is deposited at a temperature approximately 100° C. cooler than the last-to-deposit region or portion of the CdTe film/layer.

As the CdTe deposition temperature is reduced, the material has a tendency to become Cd-rich. The resulting defect chemistry includes Cd-interstitials and reduced concentrations of cadmium vacancies. This microstructure is more resistant to atomic diffusion by extrinsic dopants like copper and results in the CdTe material near the CdS layer being more resilient to degradation. In addition to being Cd-rich, the region or portion of the CdTe layer near the CdS layer (or junction or interface of the cell) is smaller grained due to the lower growth temperature.

The higher CdTe deposition near the end of the CdTe deposition provides for a defect chemistry that is more capable of accepting Group I extrinsic dopants, e.g., copper, in order to improve transport at the CdTe-back contact interface. Higher temperature CdTe likely will promote the formation of Cd vacancies, which are useful for Cu doping. High temperatures also make the CdTe grains in the region or portion of the CdTe layer near the back surface larger than the first deposited CdTe.

The method may further involve, once the CdTe source susceptor temperature reaches the maximum or peak deposition temperature (e.g., 660° C. or the like), maintaining the source temperature to achieve a target CdTe layer/film thickness. If heating to the source is turned off immediately, the resulting film thickness may be about 4 microns when a source to substrate separation distance of 1 mm is used and the reactor ambient is 0.5 Torr oxygen and 7.0 Torr He. The method further includes, after the source graphite susceptor heating is turned off, allowing the substrate with the CdTe layer to cool to some predefined post-deposition temperature, such as 100° C. at a rate of about 25° C./minute, at which point an inert gas is introduced into the chamber until the reactor reaches 1 Atm. Then, the reactor may be opened and the substrate structure can be removed for post-deposition processing such as to form a solar cell.

The post CdTe deposition processing may include, if the substrate structure is a superstrate type, treating the glass/TCO/CdS/CdTe structure in $CdCl_2$. This can be accomplished with either a vapor $CdCl_2$ treatment or a solution-based process. Typically, the glass/TCO/CdS/CdTe structure is heated with $CdCl_2$ at a temperature of approximately 370 to 430° C. (e.g., 400° C. nominal) for 5 to 20 minutes (e.g., 10 minutes nominal). The vapor $CdCl_2$ process is often performed in a CSS-like arrangement where the glass/TCO/CdS/CdTe structure is positioned over a graphite source susceptor containing $CdCl_2$. A similar process of evacuating the reactor first with an inert gas and then performing several cycle purges with $H_2$ is used. A 200° C. thermal anneal may be used to remove moisture from both the inside of the reactor as well as the $CdCl_2$, which is hydroscopic and readily absorbs water. During the CSS process, both the graphite susceptor and substrate platen are usually heated to the same temperature.

The post CdTe-deposition process may further include, after the $CdCl_2$ process, applying an appropriate contact to the CdTe surface of the glass/TCO/CdS/CdTe structure. This contact will typically contain some form of copper. Prior to application of the contact, the CdTe surface may be etched either in a nitric-phosphoric acid and water mixture (referred to an NP etch) or in a dilute mixture of bromine dissolved in methanol. These etches, however, should typically only be used in the event that the CdTe is at least about 6 microns or greater in thickness as etching can lead to shunting between the contact and the front conductor (the TCO layer) if the CdTe thickness is less. Etches have been shown to improve cell reliability when thicker CdTe films are used. The use of the CdTe CSS thermal profile shown in FIG. 3 and discussed above makes the use of these etches unnecessary in some cases.

If the substrate structure is a substrate configuration, the glass/back contact/CdTe structure can have a thin CdS layer deposited on top of the CdTe in order that a pn junction between the CdS and CdTe layers exists in the cell/module. After the CdS layer is deposited, the next post-deposition step may be to coat the CdS with a transparent conducting oxide (TCO) to serve as the front contact.

The description provided above generally emphasizes that the source supplies all or most of the heat to the substrate during the rise in temperature from the lower temperature (~200° C.) water-outgassing step (e.g., most or all of the heating after a preheat step). However, in some cases, heat is also supplied to the substrate during initial and/or later absorber material deposition steps, such as at rate/quantity that is controlled to not be enough that the substrate reaches thermal equilibrium. In other words, the substrate temperature is still being driven upwards by the source temperature, but some heat is or can still be supplied to the substrate in a more direct manner (e.g., with a heater provided specifically to heat the substrate). For example, such an embodiment may be useful to prevent or better control glass breakage because when all the heat is supplied by the source the delta-T through the glass thickness may in some cases be excessive, which can lead to breakage. This can be alleviated by supplying some heat to the glass opposite the source.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope.

The invention claimed is:

1. A method for forming a film for use as an absorber in a solar cell or other photovoltaic module, comprising:
   within one or more reactor chambers, heating an absorber material source;
   preheating a substrate to a preheat temperature; and
   after the preheating, depositing an initial film growth of absorber material from the absorber material source onto the substrate, wherein the substrate temperature during the depositing of the initial film growth is controlled to be at a lower temperature than later depositing of the film and wherein, after the preheating of the substrate, the substrate is primarily heated by radiant heat from the absorber material source.

2. The method of claim 1, further comprising performing the later depositing including depositing a later stage film growth of absorber material from the absorber material source onto the substrate, wherein the substrate temperature is changed in a graded fashion from the lower temperature to a higher temperature.

3. The method of claim 1 wherein the substrate temperature during the later depositing of the film is determined by an equilibrium temperature due to heating from the absorber material source.

4. The method of claim 1, wherein the absorber material comprises cadmium telluride (CdTe).

5. The method of claim 4, wherein a maximum temperature during the later depositing is about 660° C.

6. The method of claim 4, wherein a deposition surface of the substrate receiving the absorber material is an outer surface of a cadmium sulfide (CdS) layer.

7. The method of claim 6, wherein the film of the absorber material comprises a smaller grain region formed during the depositing of the initial film growth and a larger grain region formed during the later depositing.

8. The method of claim 7, wherein grains of the absorber material in the larger grain region are at least twice as large as grains of the absorber material in the smaller grain region.

9. The method of claim 7, wherein the smaller grain region has a thickness of less than about one half a thickness of the film of the absorber material.

10. The method of claim 7, wherein the substrate temperature during the later depositing are in a temperature range less than a maximum temperature of the absorber material source by at least about 100° C.

11. The method of claim 1, wherein the substrate and the source of the absorber material are spaced apart a separation distance in the range of 1 to 10 mm, whereby the substrate is thermally coupled to the source.

12. A method of forming a film for use as an absorber in a photovoltaic module, comprising:
   within a reactor chamber, heating an absorber material source;
   heating a substrate suspended within the reactor chamber, wherein the substrate is primarily heated by radiant heat from the absorber material source;
   depositing a first film of the absorber material onto the substrate while controlling heating of the absorber material source within a first temperature range; and
   depositing a second film of the absorber material onto the substrate while controlling heating of the absorber material source within a second temperature range greater than the first temperature range, whereby grains of the absorber material in the first film are at least twice as larger as grains of the absorber material in the second film.

13. A method for forming a film for use as an absorber in a photovoltaic module, comprising:
   within a reactor chamber, providing a source of absorber material,
   suspending a substrate over the absorber material source; and
   first heating the absorber material source to a preheat temperature and second heating the absorber material source to a maximum deposition temperature,
   wherein a film of the absorber material is deposited on surface of the substrate, and
   wherein the film of the absorber material comprises a smaller grain region and a larger grain region and wherein the smaller grain region is proximate to the surface of the substrate.

14. The method of claim 13, wherein the maximum deposition temperature is about 660° C.

15. The method of claim 13, wherein the absorber material comprises cadmium telluride.

16. The method of claim 15, wherein the surface of the substrate is an outer surface of a CdS layer.

17. The method of claim 13, wherein grains of the absorber material in the larger grain region are at least twice as large as grains of the absorber material in the smaller grain region.

18. The method of claim 17, wherein the smaller grain region has a thickness of less than about one half a thickness of the film of the absorber material.

19. The method of claim 13, wherein the second heating is controlled such that, during deposition of the film of the absorber material, the substrate has a substrate temperature within a first deposition temperature range during an initial stage of the deposition of the film and within a second deposition temperature range, greater than the first deposition temperature range, during a secondary stage of the deposition of the film.

20. The method of claim 19, wherein temperatures of the second deposition temperature range are less than the maximum deposition temperature by at least about 100° C.

21. The method of claim 13, further comprising prior to the second heating of the source of the absorber material heating the substrate to a substrate preheat temperature in the range of 150 to 250° C., the substrate preheat temperature being less than the maximum deposition temperature.

22. The method of claim 21, wherein during the second heating of the source of the absorber material the substrate heater is controlled to heat the substrate to the substrate preheat temperature, whereby the substrate is heated by the source during the second heating to at least two differing substrate deposition temperatures.

23. The method of claim 13, wherein the substrate and the source of the absorber material are spaced apart a separation distance in the range of 1 to 10 mm, whereby the substrate is thermally coupled to the source.

\* \* \* \* \*